(12) United States Patent
Kim et al.

(10) Patent No.: US 12,469,736 B2
(45) Date of Patent: Nov. 11, 2025

(54) SUBSTRATE CARRIER AND SUBSTRATE ASSEMBLY COMPRISING THE SAME

(71) Applicant: Absolics Inc., Covington, GA (US)

(72) Inventors: Sungjin Kim, Suwanee, GA (US); Jincheol Kim, Hwaseong-si (KR)

(73) Assignee: Absolics Inc., Covington, GA (US)

( * ) Notice: Subject to any disclaimer, the term of this patent is extended or adjusted under 35 U.S.C. 154(b) by 0 days.

(21) Appl. No.: 18/013,785

(22) PCT Filed: Sep. 1, 2022

(86) PCT No.: PCT/US2022/042308
§ 371 (c)(1),
(2) Date: Dec. 29, 2022

(87) PCT Pub. No.: WO2023/034479
PCT Pub. Date: Mar. 9, 2023

(65) Prior Publication Data
US 2024/0006224 A1    Jan. 4, 2024

Related U.S. Application Data

(60) Provisional application No. 63/240,023, filed on Sep. 2, 2021.

(51) Int. Cl.
*H01L 21/687* (2006.01)
(52) U.S. Cl.
CPC ............... *H01L 21/68735* (2013.01)

(58) Field of Classification Search
CPC . H01L 2924/00014; H01L 2924/15311; H01L 2924/00; H01L 2224/48091
See application file for complete search history.

(56) References Cited

U.S. PATENT DOCUMENTS

| | | | |
|---|---|---|---|
| 5,800,667 A | 9/1998 | Kosaki et al. | |
| 5,909,056 A * | 6/1999 | Mertol | H01L 23/3675 257/796 |
| 6,188,127 B1 * | 2/2001 | Senba | H01L 21/563 257/E21.503 |
| 9,018,753 B2 * | 4/2015 | Wong | H10F 39/804 257/E23.116 |

(Continued)

FOREIGN PATENT DOCUMENTS

| | | |
|---|---|---|
| JP | H10-12578 A | 1/1998 |
| JP | 2003-243336 A | 8/2003 |

(Continued)

OTHER PUBLICATIONS

International Search Report issued on Dec. 8, 2022, in related International Patent Application No. PCT/US 22/42308 (2 pages).

(Continued)

*Primary Examiner* — Mahdi H Nejad
(74) *Attorney, Agent, or Firm* — NSIP Law

(57) ABSTRACT

A substrate carrier and a substrate assembly comprising the same are provided. The substrate carrier comprises an accommodation space; a guide unit disposed adjacent to the accommodation space; and a supporting unit disposed under the accommodation space and the guide unit. The guide unit comprises a circular shape or an arc shape in the circumference when viewed from an upper position.

10 Claims, 3 Drawing Sheets

(56) References Cited

U.S. PATENT DOCUMENTS

| | | | |
|---|---|---|---|
| 2008/0142946 A1 | 6/2008 | Yang et al. | |
| 2010/0194014 A1* | 8/2010 | Huang | H01L 21/67132 |
| | | | 269/287 |
| 2011/0180893 A1* | 7/2011 | Minegishi | H10F 39/804 |
| | | | 257/E31.127 |
| 2011/0297329 A1 | 12/2011 | Canale et al. | |
| 2019/0074203 A1 | 3/2019 | Schober et al. | |
| 2023/0052565 A1* | 2/2023 | Chang | H01L 21/67092 |
| 2023/0265554 A1* | 8/2023 | Kuratomi | C23C 14/34 |
| | | | 269/257 |

FOREIGN PATENT DOCUMENTS

| | | |
|---|---|---|
| JP | 2005-317887 A | 11/2005 |
| JP | 2008-80443 A | 4/2008 |
| JP | 2013-222940 A | 10/2013 |
| JP | 2014-7290 A | 1/2014 |
| KR | 10-1171526 B | 8/2012 |
| KR | 10-1276487 B | 6/2013 |
| KR | 10-2014-0031719 A | 3/2014 |
| KR | 10-2082271 B | 4/2020 |
| KR | 10-2314986 B | 10/2021 |
| TW | 526601 B | 4/2003 |
| TW | 201135860 A1 | 10/2011 |
| TW | 201941337 A | 10/2019 |
| WO | WO 2018/225826 A1 | 12/2018 |

OTHER PUBLICATIONS

Written Opinion of the International Search Authority issued on Dec. 8, 2022, in related International Patent Application No. PCT/US 22/42308 (5 pages).

* cited by examiner

SUBSTRATE CARRIER AND SUBSTRATE ASSEMBLY COMPRISING THE SAME

CROSS-REFERENCE TO RELATED APPLICATIONS

This application is a U.S. National Stage Application of International Application No. PCT/US2022/042308, filed on Sep. 1, 2022, which claims the benefit under 35 USC 119(a) and 365(b) of U.S. Provisional Patent Application No. 63/240,023, filed Sep. 2, 2021, the entire disclosures of which are incorporated herein by reference for all purposes.

BACKGROUND

1. Field

The following disclosure relates to a substrate carrier and a substrate assembly including the same.

2. Description of Related Art

A ceramic material, such as glass, may be applies as a high-end packaging substrate, organic materials may be excluded. By forming a through via on a substrate and applying a conductive material into the through via, the length of wiring between an element and a motherboard may be shortened, and excellent electric characteristics may be obtained.

Such a substrate may be implemented to manufacture an array substrate that includes plural units for package substrates, and the array substrate may be manufactured to be a panel form in a quadrangle shape. To embody a fine and complicated implementation, a highly precise semiconductor process may be desired to be utilized. However, commercial equipment to process the array substrate in a quadrangle shape may be insufficient, and considerable time and cost for development/maintenance may be desired.

To apply this array substrate in a quadrangle shape to typical equipment for silicon-based semiconductor wafers, it is preferable to have a circumference in a circular shape similar to a wafer. However, in a present example of the size of an array substrate implemented in a quadrangle shape, considerable area loss may be generated when processing to a wafer form in twelve inches or the like is performed. Thereby, the productivity may be lowered, and mass production may not be achieved.

Thus, it may be desirable to consider various factors and configurations that can minimize the occurrence of material loss and cost, and that can heighten the productivity of a packaging process for a typical substrate in a quadrangle shape.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

A carrier substrate, including an accommodation space, configured to accommodate a substrate; a guide unit, disposed adjacent to the accommodation space; and anyone selected from a supporting unit, a fixing unit and both, wherein the supporting unit is disposed under the accommodation space and the guide unit, and the supporting unit is configured to support the guide unit and a substrate disposed in the accommodation space, and wherein the fixing unit is disposed at an inner circumference surface of the guide unit, and is configured to fix the substrate and the guide unit.

The guide unit may include one of a circular shape and an arc shape in the circumference when viewed from an upper position.

The guide unit may be configured to have a diameter equal to or greater than four inches.

The guide unit may be configured to have a thickness of 100 μm to 2000 μm.

The accommodation space may be configured to have a height that is lower than a height of the guide unit.

The supporting unit may be configured to have a thickness of 50 μm to 200 μm.

The supporting unit may include an ultraviolet (UV) curable adhesive layer, and the fixing unit comprises a UV curable adhesive material.

A substrate assembly may include a substrate carrier and a target substrate disposed in the accommodation space, wherein the target substrate and the substrate carrier are configured to be fixed to each other in a singularly formed body.

The target substrate may be a substrate selected from at least one of a silicon-based ceramic substrate, a glass-based ceramic substrate, a glass substrate, and combinations thereof.

The target substrate may include an array in which plural units for package substrates are formed.

The target substrate and the guide unit may be configured to have an interval of 0.5 mm to 20 mm.

At least a portion of the interval may be filled with a filling material.

Other features and aspects will be apparent from the following detailed description, the drawings, and the claims.

BRIEF DESCRIPTION OF DRAWINGS

Throughout the drawings and the detailed description, the same reference numerals may refer to the same, or like, elements. The drawings may not be to scale, and the relative size, proportions, and depiction of elements in the drawings may be exaggerated for clarity, illustration, and convenience.

DETAILED DESCRIPTION

Figure 1:
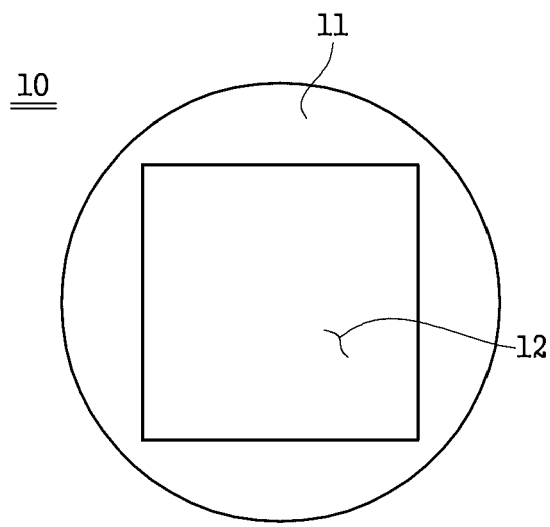
FIG. 1 illustrates a ground plan of an example substrate carrier according to embodiments viewed from an upper position.

The following detailed description is provided to assist the reader in gaining a comprehensive understanding of the methods, apparatuses, and/or systems described herein.

However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

In the one or more examples, "B being placed on A" means that B is placed in direct contact with A or placed over A with another layer or structure interposed therebetween and thus should not be interpreted as being limited to B being placed in direct contact with A.

In the one or more examples, the phrase "combination(s) thereof" included in a Markush-type expression denotes one or more mixtures or combinations selected from the group comprising components stated in the Markush-type expression, that is, denotes that one or more components selected from the group comprising the components are included.

In the one or more examples, the description of "A and/or B" means "A, B, or A and B."

In the one or more examples, terms such as "first," "second," "A," or "B" are used to distinguish the same terms from each other.

In the one or more examples, a singular form is contextually interpreted as including a plural form as well as a singular form unless specially stated otherwise.

One or more examples may provide a substrate carrier and a substrate assembly that can minimize an occurrence of loss for materials and cost. The example embodiments may help processing equipment for a typical wafer to be applied to a substrate in a quadrangle shape, and can heighten productivity of a packaging process.

One or more examples may provide a method of applying a target substrate including a ceramic (e.g., glass) in a quadrangle shape to a typical process for a wafer in a circular shape through the substrate carrier.

In one or more examples, a substrate carrier may be implemented to minimize the occurrence of material loss and costs, and productivity can be heightened when a packaging process is applied through a target substrate including a ceramic substrate (e.g., glass) in a quadrangle shape.

Substrate Carrier 10

Figure 5:
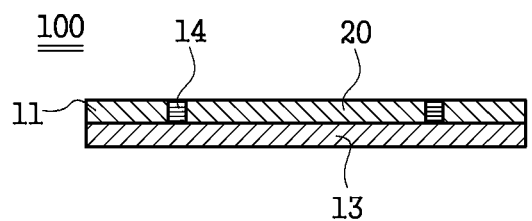
FIG. 5 illustrates a sectional view of an example substrate assembly, in accordance with one or more embodiments.

Referring to FIG. 1, a substrate carrier 10, in accordance with one or more embodiments, may comprise, an accommodation space 12 where a substrate is accommodated; a guide unit 11 disposed external to the accommodation space 12, a supporting unit 13, and a fixing unit 14 (FIG. 5).

The supporting unit 13 may support the guide unit 11 and a substrate accommodated in the accommodation space 12, and may be disposed under the accommodation space 12 and the guide unit 11.

The fixing unit 14 may be disposed in the inner circumference surface of the guide unit 11, and may fix the substrate and the guide unit 11.

In a non-limited example, the guide unit 11 may comprise a circular shape or an arc shape in the circumference in a ground plan view observed from an upper position.

The guide unit 11 may preferably have a circumference in a circular shape similar to a wafer. In an example, the guide unit 11 may have a diameter in the circumference of the outmost edge which is approximately three inches or more, approximately six inches or more, approximately twenty inches or less, or eighteen inches or less. By having such a diameter, the guide unit 11 may allow the target substrate to be easily applied to an apparatus for a wafer level packaging (WLP) process for semiconductors when a target substrate 20 is placed in the accommodation space 12.

In a non-limited example, the guide unit 11 may have a thickness of approximately 100 μm to about 2000 μm, or approximately 100 μm to approximately 1000 μm. The minimizing of the difference in thickness with a target substrate to be placed in the accommodation space 12 which has a similar thickness with the target substrate, are advantageous for subsequent packaging processes, and thereby the occurrence of defects may be minimized.

The guide unit 11 may have a flat zone (not shown) which may have a straight-line shape by cutting some of the arc in some of the circumference.

The guide unit 11 may have a notch (not shown) which may be caved toward the center direction in portions of the circumference.

The guide unit 11 may comprise, as only examples, a metal, a ceramic, a plastic, a glass, and the like, and a material which may not generate impurities and particles in a packaging process may be implemented as the guide unit 11.

For example, the guide unit 11 may be a substrate selected from the group comprising prepreg, a silicon-based ceramic substrate, a glass-based ceramic substrate, a glass substrate, or combinations thereof. Specifically, the substrate may have an accommodation space 12 in the internal portion while having an overall disk shape. The guide unit 11 may be formed as one body, or may be formed as a whole by two or more fragments.

The guide unit 11 may be applied by a UV light transmissive material. For example, a UV light transmissive plastic plate, a UV light transmissive plate glass, and the like may be applied. When the guide unit 11 is applied as a UV light transmissive material, the workability may be more increased. For example, when a supporting unit 13 whose adhesive force is weakened by UV light irradiation is applied to allow the supporting unit 13 to be omitted and manufacturing the substrate assembly, the workability of UV light irradiation and omitting the supporting unit 13 may be improved.

The guide unit 11 may be retrieved after a target substrate 20 is placed in the accommodation space 12 and the target substrate is treated to be processed, and the retrieved guide unit 11 may be reused in several times for manufacture of a substrate carrier.

Referring to the ground plan (FIG. 1) of the substrate carrier 10 viewed from an upper position, the shape of the accommodation space 12 may be a quadrangle shape having at least four sides, to accommodate a substrate in a quadrangle shape which may become a target substrate. Additionally, the accommodation space may have four vertices that are treated to be a circuitous curve of the quadrangle shape.

Figure 2:
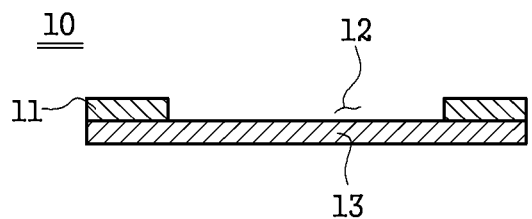
FIG. 2 illustrates a sectional view of an example substrate carrier, in accordance with one or more embodiments.

The accommodation space 12 may have an average height which is lower than a height of the guide unit 11 as illustrated in FIG. 2, and the accommodation space 12 may be an empty space which, in an example, may completely penetrate the supporting unit 13, or may expose the supporting unit 13.

When the accommodation space 12 is a quadrangle shape described in the above, the area may be about $2.5 \times 10^3$ mm$^2$ to about $2.8 \times 10^5$ mm$^2$. Additionally, the length of one side of the accommodation space 12 may be approximately 50 mm to approximately 520 mm, or approximately 75 mm to approximately 450 mm.

Figure 3:
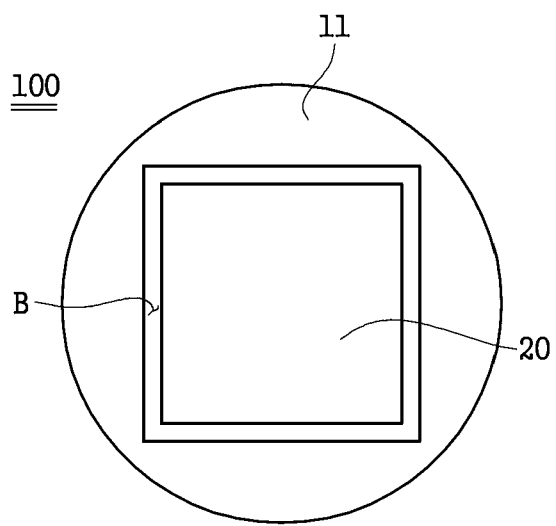
FIG. 3 illustrates a ground plan of an example substrate assembly according to embodiments viewed at an upper position.
Figure 4:
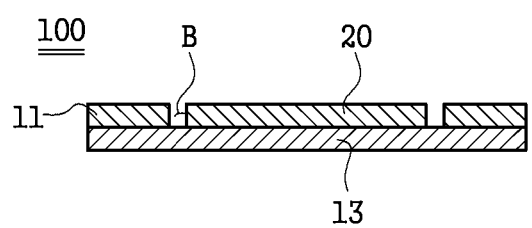
FIG. 4 illustrates a sectional view of an example substrate assembly, in accordance with one or more embodiments.
Figure 6:
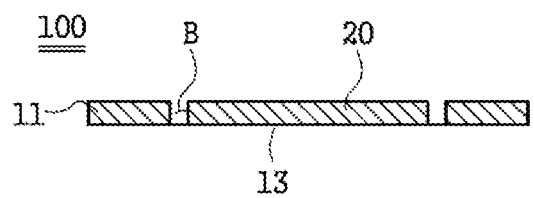
FIG. 6 illustrates a sectional view of an example substrate assembly, in accordance with one or more embodiments.

The accommodation space 12 may comprise a placing area for a target substrate 20 to be placed and a separate buffer zone B in the external of the placing area as illustrated in FIG. 3 and FIG. 4 and FIG. 6. The buffer zone B is a space or interval between the placing area of the accommodation space 12 and the guide unit 11, and may have a width of approximately 0.1 mm to approximately 2 mm, and may have a regular width overall. The accommodation space 12 prepares the buffer zone B, thereby improving workability and lowering the defect rate of a packaging process.

The placing area may have a similar shape to the external shape of the target substrate 20.

Figure 7:
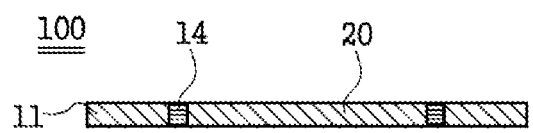
FIG. 7 illustrates a sectional view of an example substrate assembly, in accordance with one or more embodiments.

The buffer zone B may be filled with a fixing unit 14 in at least some or all of the buffer zone B thereof as illustrated in FIG. 5 or FIG. 7. The fixing unit 14 may comprise, as only examples, an epoxy resin, a polyimide resin, a polyacrylate resin, a silicon-based resin, and the like, to fill at least some of the buffer zone B, and fix the target substrate 20 and the supporting unit 13. Additionally, the fixing unit 14 may be formed by curing a composition comprising a UV curable acrylate-based compound, an acryl-based copolymer, a photoinitiator, a thermal curing agent, and the like. In one or more examples, the fixing unit 14 may decrease an adhesive strength due to additive treatment such as UV irradiation treatment after the processing of a target substrate 20 described below, and may allow separation from a guide unit 11 to be easily made.

By the implementation of the fixing unit 14, the occurrence of a short circuit or defects may be prevented in a processing operation of a target substrate 20, thus allowing the fixing or the separating of the substrate carrier 10 and a target substrate 20 to be easily made as desired.

The fixing unit 14 may contact a target substrate 20 without a separate supporting unit 13, and may fix the target substrate 20 to a guide unit 11 as illustrated in FIG. 7.

The fixing unit 14 may also further comprise a filler. The filler may comprise, as only examples, any one selected from the group comprising silica, alumina, titania, zirconia, silicon, magnesium oxide, and combinations thereof.

The supporting unit 13 may be implemented to support a target substrate 20 which is placed in the accommodation space 12, may be in contact with the target substrate 20 when the target substrate 20 is placed in the accommodation space 12, and may further comprise an adhesive layer disposed between the target substrate 20 and the supporting unit 13.

The supporting unit 13 may have a thickness of approximately 20 μm to approximately 200 μm, or approximately 80 μm to approximately 180 μm. By having such a thickness, the supporting unit 13 can be effectively removed after a cutting process in a processing operation of a target substrate 20.

The supporting unit 13 may comprise a UV curable adhesive layer. The supporting unit 13 may be one where a support film and a UV curable adhesive layer on the support film are arranged. The supporting unit 13 may be a UV curable adhesive layer in a form of an adhesive tape, or may be one composed of a UV curable adhesive layer without a separate material.

In an example, the UV curable adhesive layer may be formed by curing a composition comprising a UV curable acrylate-based compound, an olefin-based compound, an ester-based compound, a polyvinyl chloride-based compound, an acryl-based copolymer, a photoinitiator, a thermal curing agent, and the like, but the composition is not limited thereto.

The supporting unit 13 may comprise other adhesive layers. The other adhesive layers may comprise an acryl-based oligomer, an isocyanate-based curing agent, an amine-based curing agent, and the like.

Additionally, the supporting unit 13 may apply a polyester-based film, a polyolefin-based film, a polyvinyl chloride-based film, a polyethylene-based film, and the like as the supporting film.

The thickness of the UV adhesive layer and other adhesive layers may be about 10 μm to 180 μm, and the thickness is not limited thereto if any thickness is used to make adhesion and support of a target substrate easily.

The UV adhesive layer and other adhesive layers may have an adhesive strength of approximately 300 gf/25 mm to approximately 3500 gf/25 mm, or approximately 1000 gf/25 mm to approximately 3500 gf/25 mm with the target substrate 20. By having such an adhesive strength, the target substrate 20 and the supporting unit 13 may be easily fixed in a processing method for the target substrate 20 described below.

When the supporting unit 13 comprises the UV curable adhesive layer and other adhesive layers, the guide unit 11 may be composed of a material in which UV can be sufficiently transmitted, and for example, may comprise glass.

The supporting unit 13 may be resistant to a developing solution (tetramethylammonium hydroxide, TMAH) or the like, and may be maintained before a cutting process in a processing operation of the target substrate 20.

The supporting unit 13 may have an adhesive strength that is lowered by UV irradiation.

The supporting unit 13 may be a so-called thermal delamination adhesive layer whose adhesive strength is lowered by heat.

The substrate carrier 10 may have a heat resistance at a temperature of approximately 150° C. to approximately 200° C., and the appearance and properties may not change substantially even after being kept for approximately one hour at a temperature of approximately 200° C.

Through the substrate carrier 10, a target substrate, particularly an array substrate comprising glass in a quadrangle shape and comprising plural units for packaging substrates may be applied to a wafer level packaging process, and thereby the occurrence of material loss and costs may be minimized, and the productivity may be improved.

Substrate Assembly 100

In one general aspect, a substrate assembly, in accordance with one or more embodiments, comprises, a substrate carrier 10 as described above; and a target substrate 20 implemented in the accommodation space 12.

The target substrate 20 may be a substrate selected from the group comprising a silicon-based ceramic substrate, a glass-based ceramic substrate, a glass substrate, and combinations thereof.

The ceramic substrate may be, for example, a silicon-based ceramic substrate and a glass-based ceramic substrate. The silicon-based ceramic substrate may be a substrate comprising a silicon substrate, a silicon carbide substrate, and the like in some or the whole thereof. The glass-based ceramic substrate may be a substrate comprising a quartz substrate, a sapphire substrate, and the like in some or the whole thereof.

The target substrate may be a glass substrate. The glass substrate may be for example, an alkali borosilicate plate glass, a non-alkali borosilicate plate glass, a non-alkali alkali-earth borosilicate plate glass, and the like, and any plate glass applicable as an electronic component may be applied thereto.

The target substrate may be an array substrate in which plural units for package substrates are equipped, and may comprise glass. The glass comprised in the target substrate may be, as examples, a borosilicate glass, a non-alkali glass, or the like.

The target substrate 20 may have a quadrangle shape, and the area may be approximately $1.5 \times 10^5$ mm$^2$ to approximately $4 \times 10^5$ mm$^2$. Additionally, the length of one side of the target substrate may be approximately 450 mm to approximately 550 mm.

The target substrate 20 may generate considerable area loss when processed in a commercial wafer form, and thus may be applied to a wafer level packaging process in a state of being placed in the carrier substrate 10.

The accommodation space 12 and the target substrate 20 may comprise a buffer zone B therebetween. The buffer zone B may have a width of approximately 0.1 mm to approximately 2 mm as a space or interval between the target substrate 20 and the guide unit 11, and may have a regular width overall. The accommodation space 12 may prevent the target substrate 20 inside the accommodation space 12 from being polluted with impurities by preparing the buffer zone B, and may thereby lower the defect rate of a packaging process.

The buffer zone B may be filled with a fixing unit 14 in at least some or all of the buffer zone B thereof. Components that may be comprised in the fixing unit 14 are the same as the above description of the Substrate Carrier 10, and thus further description is omitted. By implementing the fixing unit 14, the occurrence of a short circuit or defects in a processing operation of a target substrate 20 may be prevented, thus allowing the fixing or the separating of the substrate carrier 10 and the target substrate 20 to be easily made.

The adhesive strength between the target substrate 20 and the supporting unit 13 may be approximately 300 gf/25 mm to approximately 3500 gf/25 mm, or approximately 1000 gf/25 mm to approximately 3500 gf/25 mm. By having such an adhesive strength, a target substrate and a supporting unit 13 may be easily fixed in a processing method for the target substrate described below.

After irradiating UV of approximately 400 mJ/cm$^2$ to the supporting unit 13 evenly, the adhesive strength with the target substrate 20 may be approximately 5 gf/25 mm to about 150 gf/25 mm.

The substrate assembly 100 may be applied to a processing method for a target substrate described below, and may also be applied to a wafer level packaging (WLP) process.

Configurations and the like related to the substrate carrier 10 of the substrate assembly 100 are the same as the above description of a substrate carrier, and thus the further description is omitted.

Manufacturing Method for Substrate Carrier, Fixing Method, and Separating Method In one general aspect, a manufacturing method for a substrate carrier according to embodiments may comprise, an operation for preparing an optional material comprising a circular shape or an arc shape in the circumference as viewed at an upper position; and an operation that forms a supporting unit 13 in a lower portion.

In the operation that forms the accommodation space 12 and the guide unit 11, the inside of an optional material may be processed to be penetrated partially to form a preliminary accommodation space 12, and the remaining area may become a guide unit 11. The processing may be performed, as only examples, by mechanical etching, laser processing, or the like.

In the operation that forms the accommodation space 12 and the guide unit 11, a process of processing a penetrated portion of the preliminary accommodation space 12 to be a form of the accommodation space described in the above may be comprised.

In the operation that forms the supporting unit 13, a supporting unit in a form that finishes the lower portion of the accommodation space 12 and the guide unit 11 may be treated to be attached with the lower portion of the guide unit 11. On the other hand, a raw material may be applied on a separate mold, and the lower portion of the guide unit 11 may be allowed to be contacted with the applied layer, to be treated to be cured.

The fixing unit 14 is arranged between the target substrate 20 and the guide unit 11 to fix the target substrate 20 and the guide unit 11, and a detailed filling material and the like are the same as described above.

The fixing unit 14 may be formed in a method of disposing the target substrate 20 when un-cured or semi-cured filling material has been disposed, and may be formed through an additional curing or fixing process, as only examples. Additionally, the fixing unit 14 may be manufactured by temporarily disposing the target substrate 20 and the guide unit 11 on a supporting film, after that process, forming a fixing unit, and removing the supporting film.

The material of the supporting unit 13 may be the same as the above description of a substrate carrier, and thus further description is omitted.

In one general aspect, a fixing method of a target substrate 20 according to one embodiment comprises, a preparation operation for preparing a substrate carrier 10 and a target substrate 20; and an assembly formation operation of fixing the target substrate 20 by a supporting unit 13 or a fixing unit 14 of the substrate carrier 10 to obtain a substrate assembly formed as one body.

The substrate carrier 10 comprises an accommodation space 12 where a target substrate 20 is accommodated, and a guide unit 11 surrounding the accommodation space 12 and allowing the target substrate 20 to have a substantially outward form of a disk shape.

The substrate assembly comprises a target substrate 20 which is disposed in the accommodation space 12 and a substrate carrier 10 fixed through at least one between a supporting unit 13 or a fixing unit 14.

The supporting unit 13 may comprise a UV light curable adhesive layer.

The fixing unit 14 may be in contact with at least portions of the target substrate and the guide unit 11 to fix the target substrate 20 and the guide unit 11, and an interval between the target substrate 20 and the guide unit 11 may have a length of 0.5 mm to 20 mm.

The guide unit 11 may be a substrate selected from the group comprising prepreg, a silicon-based ceramic substrate, a glass-based ceramic substrate, a glass substrate, and combinations thereof.

The target substrate may be a substrate selected from the group comprising a glass-based ceramic substrate, a glass substrate, and combinations thereof.

In one general aspect, a separating method of a target substrate according to one embodiment includes a preparation operation for preparing a substrate assembly; and a treatment operation of basking in UV light or heat to the substrate assembly to prepare a substrate assembly in which the adhesive force of a supporting unit 13 or a fixing unit 14 included in the substrate assembly, is decreased.

A separation operation, which adds opposite forces in upward and downward directions to the guide unit 11 of the substrate assembly decreased in the adhesive force and the target substrate, respectively, may be further included.

In an example, the guide unit 11 may be a UV transmissive guide unit. In the treatment operation, the UV may be transmitted to the fixing unit 14 or the supporting unit 13 by passing through the UV transmissive guide unit.

The detailed description of the guide unit 11, the target substrate 20, the fixing unit 14, the supporting unit 13, and the like is overlapped with the above description and thus the further description is omitted.

Processing Method for Target Substrate

In one general aspect, a processing method for a target substrate 20 may comprise, an operation of forming a first plating layer on one surface of a target substrate 20 of a substrate assembly according to the above description; an operation of forming a resist pattern on the first plating layer, and forming a second plating layer in the remaining portion except for the resist pattern; and an operation of forming a solder on the second plating layer, and removing the resist pattern and the first plating layer in a lower portion of the resist pattern.

The target substrate 20 may comprise an array that forms plural units for package substrates.

A conductive pad and a passivation layer may be comprised on one surface of the target substrate 20, and the first plating layer may be formed on the conductive pad and the passivation layer.

In the operation of forming the first plating layer, the first plating layer may comprise, as only examples, titanium, chrome, aluminum, copper, tungsten, or an alloy thereof.

The first plating layer may comprise a first layer comprising, as only an example, titanium, and a second layer formed on the first layer and comprising copper, as only an example.

The formation of the first plating layer may proceed on one surface of the target substrate, or on a conductive pad or a passivation layer of one surface of the target substrate through a sputtering process or the like.

The formation of the resist pattern may proceed as a typical method of applying a photoresist on the first plating layer, exposing, developing, and etching through a mask in which a pattern is formed.

In the operation to form the second plating layer, the second plating layer may comprise, as examples, copper, nickel, or an alloy thereof.

The formation of the second plating layer may proceed through electroplating or electroless plating.

In the formation of a solder on the second plating layer, the solder may be a solder comprising lead, tin, and the like, or may be a lead-free solder comprising silver, tin, zinc, aluminum, magnesium, gallium, and the like.

The operation to remove a first plating layer in a lower portion of the resist pattern may proceed as a typical method through an etching solution. The etching solution may comprise a hydrofluoric acid and the like.

After the operation to remove a first plating layer in a lower portion of the resist pattern, a predetermined thermal treatment process may proceed for adjustment of the remaining plating layer and components connected thereto.

After the operation to remove the first plating layer, a process that processes the solder into a solder ball shape may be further comprised.

After the operation to remove the first plating layer, when the target substrate 20 comprises an array comprising plural units for package substrates, a cutting process of cutting the array into individual units for package substrates may proceed. Additionally, an operation to remove the remaining supporting unit 13 in a lower portion of package substrate units may be further performed after the cutting process. The removal of the supporting unit 13 may be made by irradiating UV evenly when the supporting unit 13 comprises a UV curable adhesive layer.

After the operation to remove the supporting unit 13, an operation to retrieve a guide unit 11 disposed on the supporting unit 13 which had been before the removal thereof may be further performed. The retrieved guide unit may be applied to a manufacturing method for the substrate carrier, and may be reused in a plural times.

The processing method for the target substrate may further comprise an operation for deposition of multilayered metal thin-film wiring to the target substrate, and an operation to form a rewiring layer.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A substrate carrier, comprising:
   a quadrangular accommodation space configured to accommodate a quadrangular substrate;
   a guide unit adjacent to the accommodation space and having a continuous annular structure extending around a periphery of the accommodation space; and
   a supporting unit and a fixing unit,
   wherein the supporting unit is disposed under both the accommodation space and the guide unit, and supports both the guide unit and a lower surface of the substrate,
   wherein the fixing unit is disposed at an inner circumferential surface of the guide unit and comprises a UV curable adhesive material configured to bond the substrate to the guide unit, and
   wherein the guide unit has a circular or arc-shaped periphery when viewed from above, comprises a material selected from a polymer or ceramic that is transparent to UV radiation, and has an outer diameter of four inches or greater.

2. The substrate carrier of claim 1,
   wherein the guide unit has a thickness in a range from 100 μm to 2000 μm, and the thickness is uniform along a radial direction of the guide unit.

3. The substrate carrier of claim 1,
   wherein the accommodation space has a depth less than a height of the guide unit, such that an upper surface of the substrate is recessed relative to an upper surface of the guide unit.

4. The substrate carrier of claim 1,
   wherein the supporting unit has a thickness in a range from 50 μm to 200 μm.

5. The substrate carrier of claim 1,
   wherein the supporting unit comprises an ultraviolet (UV) curable adhesive layer disposed below the substrate.

6. A substrate assembly, comprising:
   a substrate carrier according to claim 1,
   wherein the quadrangular substrate is a target substrate disposed in the accommodation space, and
   wherein the target substrate and the substrate carrier are bonded to form a single integral structure via the UV curable adhesive material.

7. The substrate assembly of claim 6,
   wherein the target substrate is selected from at least one of a silicon-based ceramic substrate, a glass-based ceramic substrate, a glass substrate, and combinations thereof.

8. The substrate assembly of claim 6,
   wherein an area of the target substrate is in a range from approximately $1.5 \times 10^5$ mm$^2$ to approximately $4 \times 10^5$ mm$^2$.

9. The substrate assembly of claim 6,
   wherein the target substrate and the guide unit are configured to have an interval of 0.5 mm to 20 mm.

10. The substrate assembly of claim 9,
    wherein at least a portion of the interval is filled with a filling material.

* * * * *